(12) United States Patent
Krotosky et al.

(10) Patent No.: US 12,013,304 B2
(45) Date of Patent: Jun. 18, 2024

(54) ELECTRONIC FORCE AND PRESSURE SENSOR DEVICES HAVING FLEXIBLE LAYERS

(71) Applicant: PRECISION BIOMEMS CORPORATION, Addison, TX (US)

(72) Inventors: Jeffrey Krotosky, Lewisville, TX (US); Zhihua Cai, Plano, TX (US)

(73) Assignee: PRECISION BIOMEMS CORPORATION, Addison, TX (US)

( * ) Notice: Subject to any disclaimer, the term of this patent is extended or adjusted under 35 U.S.C. 154(b) by 0 days.

(21) Appl. No.: 17/386,491

(22) Filed: Jul. 27, 2021

(65) Prior Publication Data

US 2022/0026290 A1    Jan. 27, 2022

Related U.S. Application Data

(60) Provisional application No. 63/057,130, filed on Jul. 27, 2020.

(51) Int. Cl.

| | |
|---|---|
| *G01L 1/18* | (2006.01) |
| *G01K 7/22* | (2006.01) |
| *G01L 9/00* | (2006.01) |
| *G01L 19/00* | (2006.01) |
| *G01N 27/22* | (2006.01) |

(Continued)

(52) U.S. Cl.
CPC .............. *G01L 9/0052* (2013.01); *G01K 7/22* (2013.01); *G01L 1/18* (2013.01); *G01L 9/0055* (2013.01); *G01L 19/0092* (2013.01); *G01N 27/221* (2013.01); *G01N 27/223* (2013.01); *H05K 1/0277* (2013.01); *H05K 1/0283* (2013.01); *H05K 1/0393* (2013.01)

(58) Field of Classification Search
CPC . G01L 1/18; G01L 2009/0069; G01L 9/0054; G01L 9/0055; G01L 1/2293; G01L 1/2206; G01L 1/205; G01B 7/18
See application file for complete search history.

(56) References Cited

U.S. PATENT DOCUMENTS 3,537,319 A * 11/1970 Yerman .................. G01L 9/0054
148/DIG. 12
3,697,918 A * 10/1972 Orth ....................... G01L 9/0054
73/777

(Continued)

*Primary Examiner* — Tran M. Tran
(74) *Attorney, Agent, or Firm* — DLA Piper LLP US

(57) ABSTRACT

A flexible electronic sensor array apparatus comprising: a continuous flexible sheet having a length defining a first axis, a width defining a second axis and a thickness comprising a third axis; wherein the flexible sheet comprises multiple flexible sheet layers formed of one or more flexible materials stacked along the third axis; a plurality of electronic sensors disposed within the flexible sheet, each respective sensor comprising at least two conductive pattern layers, the two conductive pattern layers of the respective sensor spaced apart from one another along the third axis by one of the flexible sheet layers interposed between the conductive pattern layers; and wherein each respective sensor of the plurality of sensors is disposed at a different respective position along the first axis or the second axis of the flexible sheet from the remaining sensors, thereby forming an array of sensors spaced along the first and second axes.

13 Claims, 6 Drawing Sheets

(51) Int. Cl.
*H05K 1/02* (2006.01)
*H05K 1/03* (2006.01)

(56) References Cited

U.S. PATENT DOCUMENTS

| | | | | |
|---|---|---|---|---|
| 3,743,926 A * | 7/1973 | Yerman | G01L 9/0054 | 73/765 |
| 3,994,009 A * | 11/1976 | Hartlaub | G01L 1/2293 | 257/419 |
| 4,035,823 A * | 7/1977 | Marshall | H04R 23/006 | 257/419 |
| 4,173,900 A * | 11/1979 | Tanabe | H01L 29/84 | 338/42 |
| 4,511,878 A * | 4/1985 | Shimada | G01L 19/147 | 257/419 |
| 4,530,244 A * | 7/1985 | Starr | G01L 9/065 | 338/42 |
| 4,777,826 A * | 10/1988 | Rud, Jr. | G01L 9/045 | 338/195 |
| 5,349,867 A * | 9/1994 | Park | G01L 9/0051 | 338/4 |
| 6,234,027 B1 * | 5/2001 | Schatz | G01L 9/0055 | 73/754 |
| 6,289,738 B1 * | 9/2001 | Zabler | B60T 8/171 | 73/726 |
| 6,422,088 B1 * | 7/2002 | Oba | G01R 17/10 | 73/754 |
| 6,595,065 B2 * | 7/2003 | Tanizawa | G01L 9/0055 | 73/720 |
| 6,789,431 B2 * | 9/2004 | Ishio | G01L 9/0054 | 73/754 |
| 6,865,951 B2 * | 3/2005 | Katsumata | G01L 9/0054 | 73/777 |
| 6,973,836 B2 * | 12/2005 | Katsumata | G01L 9/065 | 73/715 |
| 7,082,834 B2 * | 8/2006 | Petrova | G01L 9/0055 | 361/283.1 |
| 7,159,466 B2 * | 1/2007 | Hasegawa | G01P 15/0802 | 73/754 |
| 7,509,866 B2 * | 3/2009 | Krog | G01L 9/0054 | 73/726 |
| 7,540,198 B2 * | 6/2009 | Ichikawa | G01L 9/0054 | 73/754 |
| 7,823,456 B2 * | 11/2010 | Krog | G01L 9/0054 | 73/726 |
| 7,884,432 B2 * | 2/2011 | Zorich | G01L 19/069 | 257/421 |
| 8,316,533 B2 * | 11/2012 | Suminto | G01L 9/0055 | 29/25.35 |
| 8,601,885 B2 * | 12/2013 | Delapierre | G01L 5/162 | 73/862.041 |
| 8,866,241 B2 * | 10/2014 | Gaynor | B81B 7/0006 | 257/419 |
| 9,606,012 B2 * | 3/2017 | Akiyama | H01L 29/84 | |
| 9,689,767 B2 * | 6/2017 | Van Der Wiel | G01L 19/04 | |
| 9,804,048 B2 * | 10/2017 | Zhang | G01L 13/00 | |
| 9,897,502 B2 * | 2/2018 | Wosnitza | G01L 9/0052 | |
| 10,156,489 B2 * | 12/2018 | Yin | G01L 9/0055 | |
| 10,260,981 B2 * | 4/2019 | Holm | G01L 9/0052 | |
| 10,317,297 B2 * | 6/2019 | Van Der Wiel | G01L 9/0055 | |
| 10,481,026 B2 * | 11/2019 | May | G01L 9/0055 | |
| 10,495,529 B2 * | 12/2019 | Lipowski | G01L 1/246 | |
| 10,571,348 B2 * | 2/2020 | Wade | G01L 1/2293 | |
| 10,871,413 B2 * | 12/2020 | Zwijze | G01L 9/0051 | |
| 10,955,304 B2 * | 3/2021 | Ramezani | H01L 21/22 | |
| 11,137,299 B2 * | 10/2021 | Abbasi Gavarti | H01L 41/25 | |
| 11,262,256 B2 * | 3/2022 | Molinazzi | H01C 17/24 | |
| 11,501,933 B2 * | 11/2022 | Wu | G01L 1/2287 | |
| 11,754,486 B2 * | 9/2023 | Kang | B01L 3/502715 | 435/29 |
| 11,885,704 B2 * | 1/2024 | Krotosky | G01L 9/0055 | |
| 2001/0039837 A1 * | 11/2001 | Tanizawa | G01L 9/0055 | 73/715 |
| 2004/0079159 A1 * | 4/2004 | Muchow | G01L 9/06 | 73/716 |
| 2012/0285254 A1 * | 11/2012 | Niimura | H01L 27/0629 | 73/754 |
| 2013/0118264 A1 * | 5/2013 | Walter | G01L 9/00 | 73/717 |
| 2014/0042566 A1 * | 2/2014 | Ota | G01L 1/2293 | 257/417 |
| 2020/0118719 A1 * | 4/2020 | Milke | H01C 17/0652 | |
| 2023/0043301 A1 * | 2/2023 | Okamoto | G01L 1/146 | |

* cited by examiner

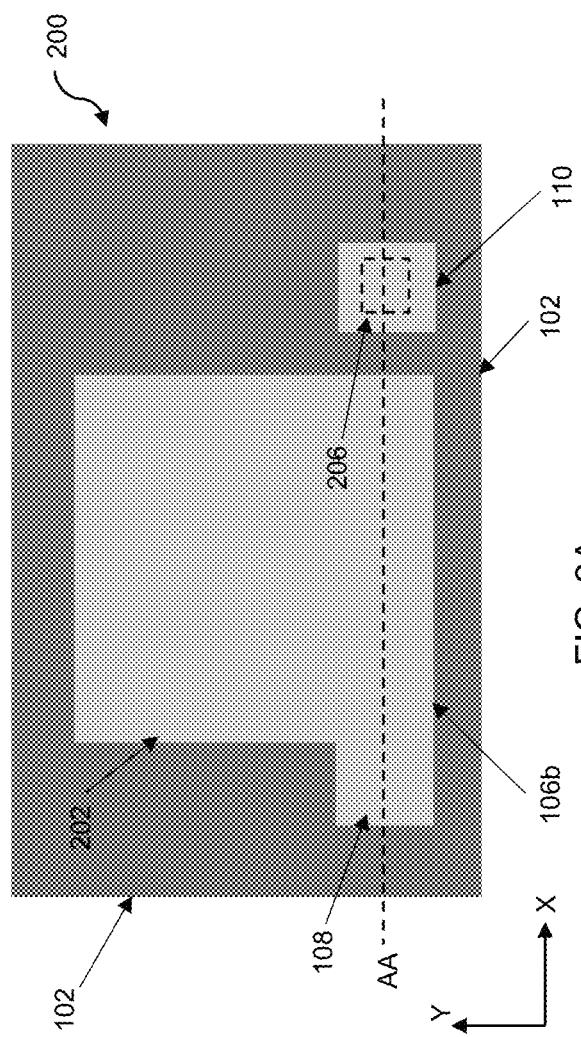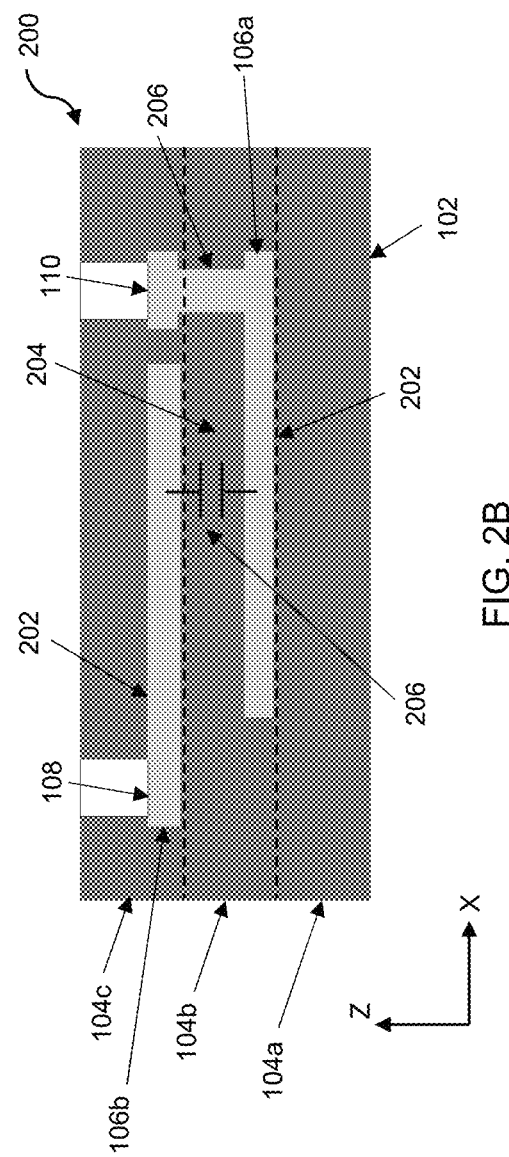

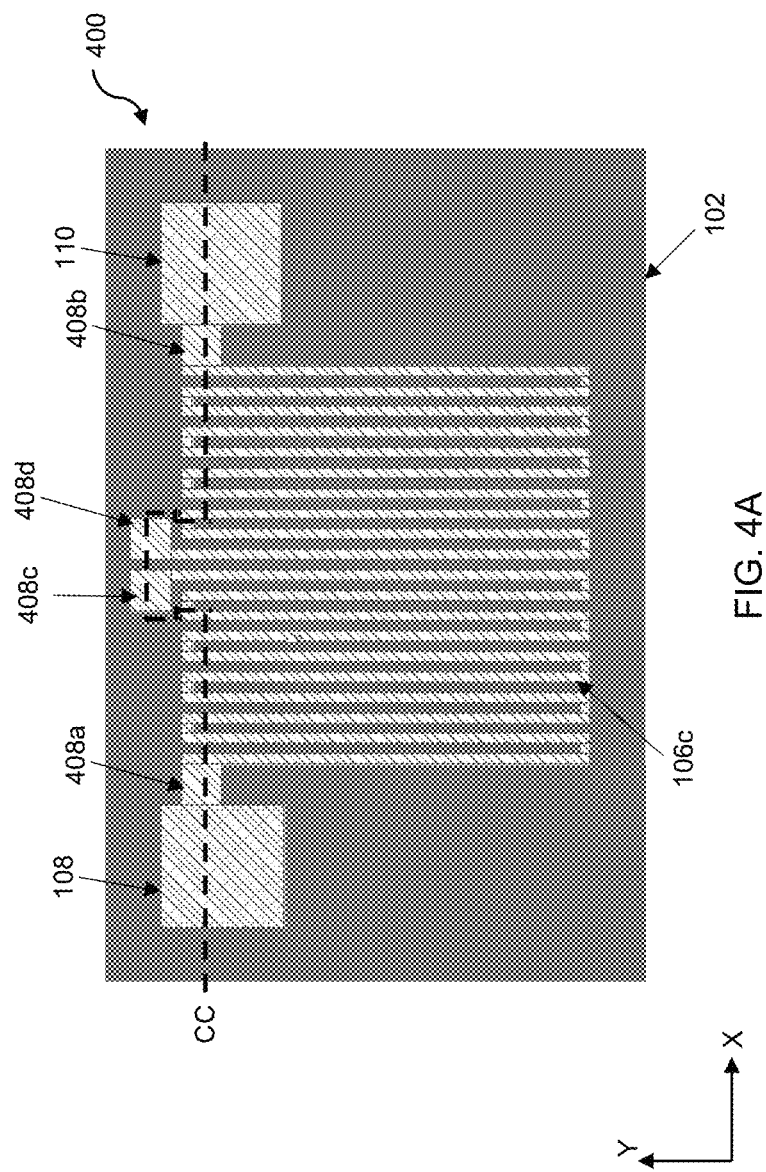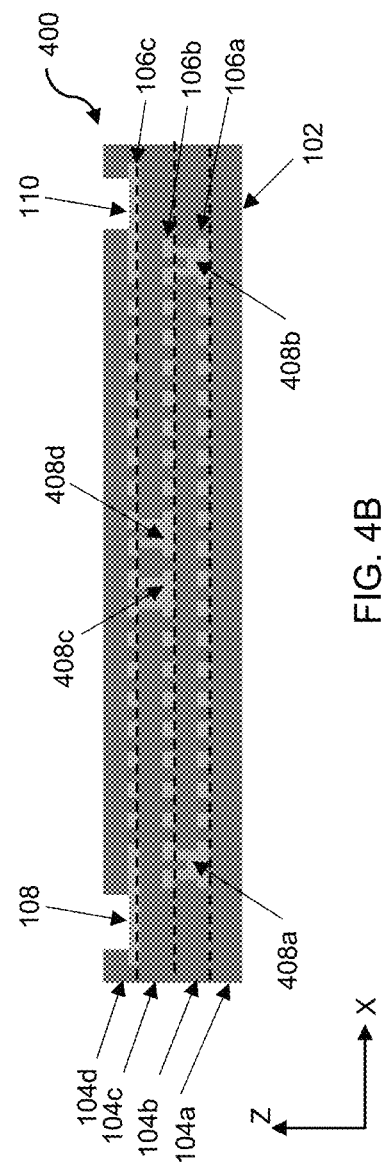
FIG. 4A
FIG. 4B

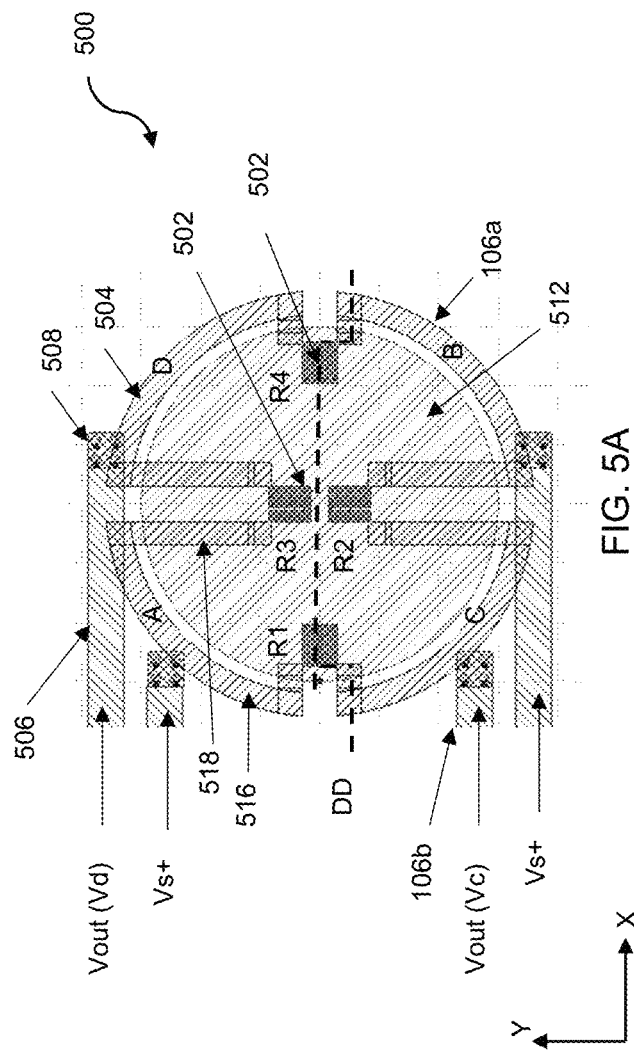
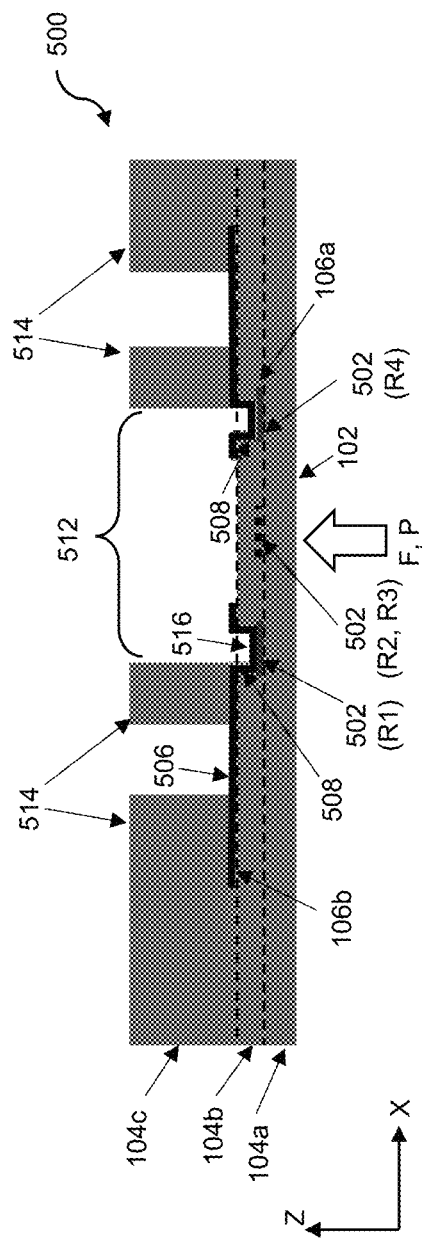

ELECTRONIC FORCE AND PRESSURE SENSOR DEVICES HAVING FLEXIBLE LAYERS

CROSS-REFERENCE TO RELATED APPLICATIONS

This application claims benefit of U.S. Provisional Application No. 63/057,130, filed Jul. 27, 2020, entitled FLEXIBLE TWO-DIMENSIONAL SHEET ARRAY OF ELECTRONIC SENSOR DEVICES, the specifications of which are incorporated by reference herein in their entirety.

TECHNICAL FIELD

The disclosure relates to apparatus comprising multiple electronic sensor devices, and in particular to apparatus wherein the multiple electronic sensor devices are configured in an array. In one embodiment, multiple layers of flexible material are stacked to form a flexible sheet having a two-dimensional array of electronic sensor devices disposed therein.

BACKGROUND

In detecting properties along the surface of an object or at an interface between objects, there is a need to accurately detect values of temperature, pressure, moisture and/or other such values across an irregularly-shaped or curved surface or within a region of the surface. In addition, there is a need to detect values of temperature, pressure, moisture and/or other such values on surfaces having dynamically changing configurations such as flexing surfaces.

SUMMARY

To solve the above-mentioned problems, it is an aspect of the current invention to provide a flexible electronic sensor array apparatus formed as a flexible sheet and comprising a two-dimensional array of electronic sensor devices. The flexible electronic sensor array apparatus can be used to sense properties across an irregular surface. Since multiple sensors can be located throughout the flexible sheet, the properties detected can be associated with certain locations of the irregular surface.

It is an aspect of this disclosure to provide a flexible electronic sensor array apparatus comprising: a continuous flexible sheet having a length defining a first axis, a width defining a second axis and a thickness comprising a third axis; wherein the flexible sheet comprises multiple flexible sheet layers formed of one or more flexible materials stacked along the third axis; a plurality of electronic sensors disposed within the flexible sheet, each respective sensor comprising at least two conductive pattern layers formed of an electrically conductive material, the two conductive pattern layers of the respective sensor being spaced apart from one another along the third axis by at least one of the flexible sheet layers interposed between the conductive pattern layers; and wherein each respective sensor of the plurality of sensors is disposed at a different respective position along at least one of the first axis and the second axis of the flexible sheet from the remaining sensors, thereby forming an array of sensors spaced along the first and second axes within the flexible sheet.

It is an aspect of this disclosure to provide a flexible electronic sensor array apparatus, wherein the array of sensors includes at least three sensor rows spaced apart within the flexible sheet along the first axis, with each respective sensor row including at least three sensors of the plurality of electronic sensors spaced apart within the flexible sheet along the second axis.

It is an aspect of this disclosure to provide a flexible electronic sensor array apparatus, wherein at least some of sensors of the plurality of electronic sensors are flexible thermistor temperature sensors.

It is an aspect of this disclosure to provide a flexible electronic sensor array apparatus, wherein the conductive pattern layers of the respective flexible thermistor temperature sensors are metal pattern layers connected to one another by conductive vias formed through the intervening flexible sheet layers.

It is an aspect of this disclosure to provide a flexible electronic sensor array apparatus, wherein at least some of the sensors of the plurality of electronic sensors are flexible pressure sensors.

It is an aspect of this disclosure to provide a flexible electronic sensor array apparatus, wherein the conductive pattern layers of the respective flexible pressure sensors include metal pattern layers disposed on a membrane portion of the flexible sheet, the metal pattern layers forming a voltage divider circuit that is electrically responsive to physical flexing of the membrane portion.

It is an aspect of this disclosure to provide a flexible electronic sensor array apparatus, wherein at least some of the sensors of the plurality of electronic sensors are flexible humidity sensors.

It is an aspect of this disclosure to provide a flexible electronic sensor array apparatus, wherein the conductive pattern layers of the respective flexible humidity sensors include at least two a plate portions, the respective plate portions being separated by one of the flexible sheet layers positioned therebetween, wherein water absorption by the flexible sheet layer positioned between the respective plate portions changes a dielectric constant between the respective plate portions responsive to changes in a local humidity.

It is an aspect of this disclosure to provide a flexible electronic sensor array apparatus, further including at least one conductive lead for each electronic sensor, each respective conductive lead having a respective first end connected to the respective electronic sensor and being routed between the flexible sheet layers of the flexible sheet to a respective second end.

It is an aspect of this disclosure to provide a flexible electronic sensor array apparatus, wherein the respective second ends of multiple respective conductive leads are disposed within a connection block positioned on an outer surface of the flexible sheet.

It is an aspect of this disclosure to provide a flexible electronic sensor array apparatus, wherein the conductive pattern layers are formed of a metal or metal alloy.

It is an aspect of this disclosure to provide a flexible electronic sensor array apparatus, wherein the flexible sheet layers are formed of a flexible polyimide material.

It is an aspect of this disclosure to provide a method for manufacturing a flexible electronic sensor array apparatus, the method comprising: forming a first flexible sheet layer having a length defining a first axis, a width defining a second axis and a thickness comprising a third axis; forming, for a plurality of electronic sensors, a first conductive pattern layer on a top of the first flexible sheet layer along the third axis, each of the plurality of electronic sensors having a position along at least the first axis and the second axis different from the remaining electronic sensors; forming a second flexible layer on a top the plurality of first conductive pattern layers along the third axis; forming, for each of the plurality of electronic sensors, a second conductive pattern layer on a top the second flexible layer along the third axis; and forming a third flexible layer on a top the plurality of second conductive pattern layers along the third axis.

It is an aspect of the disclosure to provide a method for manufacturing a flexible electronic sensor array apparatus, wherein the method further comprises forming a conductive via between the first conductive pattern layer and the second conductive pattern layer through an intervening portion of the second flexible layer to electrically connect the first conductive pattern layer to the second conductive pattern layer.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 2A illustrates a top view of an example of a humidity sensor that can be used as one, multiple, or all of the sensors in a flexible electronic sensor array apparatus according to an embodiment of this disclosure;

FIG. 2B illustrates a cross-sectional view taken along line AA of FIG. 2A;

FIG. 4A illustrates an example of a thermistor that can be used as one, multiple, or all of the sensors in a flexible electronic sensor array apparatus to an embodiment of this disclosure.

FIG. 4B illustrates a cross-sectional view taken along line CC of FIG. 4A.

FIG. 5A illustrates an example of a pressure sensor that can be used as one, multiple, or all of the sensors in a flexible electronic sensor array apparatus according to an embodiment of this disclosure;

FIG. 5B illustrates a cross-sectional view taken along line DD of FIG. 5A; and

DETAILED DESCRIPTION

Figure 1:
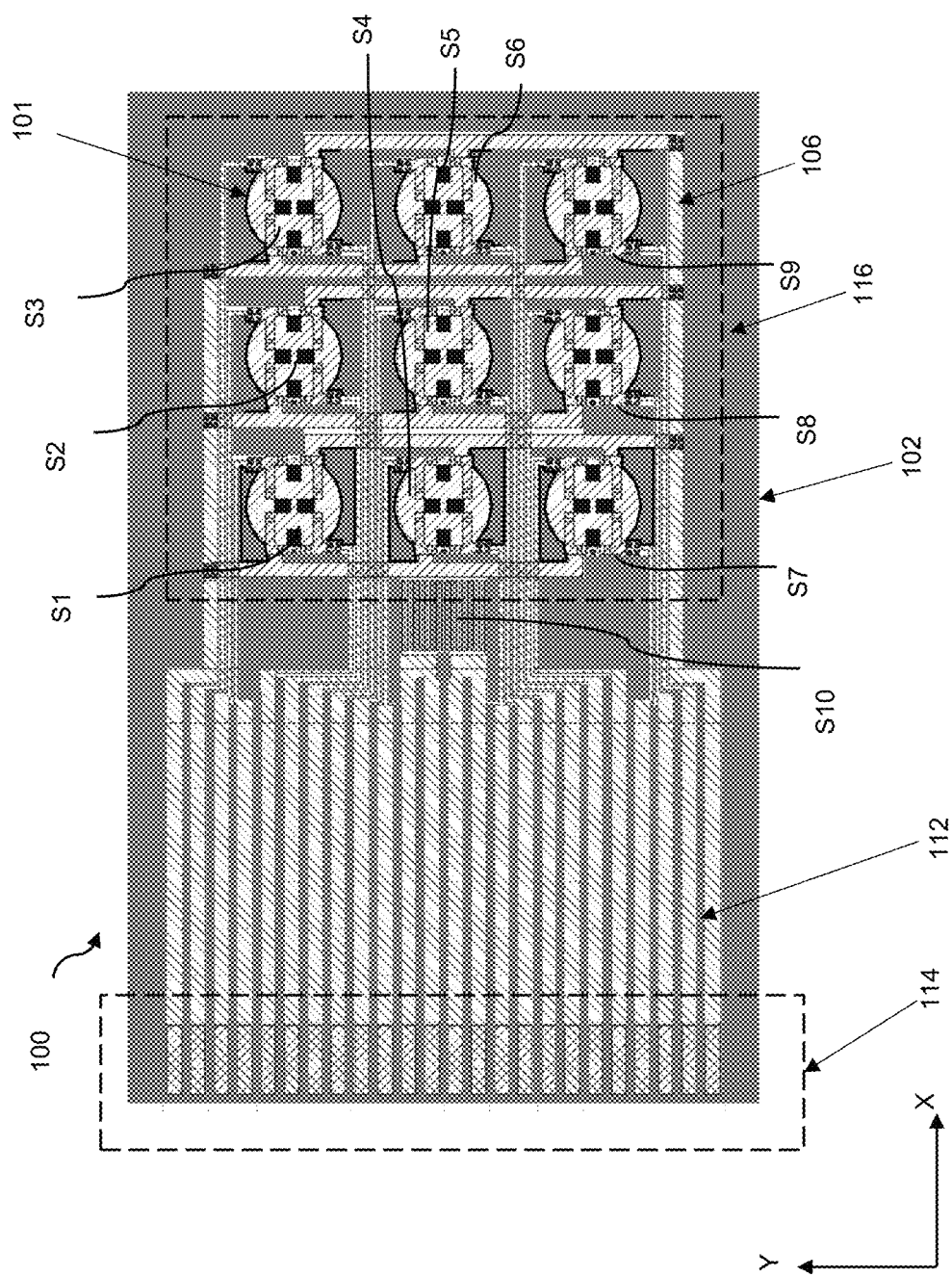
FIG. 1 illustrates a top view of a flexible electronic sensor array apparatus in accordance with an embodiment of the disclosure.

FIG. 1 illustrates a top view of a flexible electronic sensor array apparatus 100 in accordance with an embodiment of the disclosure. The flexible electronic sensor array apparatus 100 can also be referred to herein as a flexible sensor sheet or a sensor sheet. The sensor sheet 100 is comprised of a plurality of sensors 101, denoted S1-Sn. The sensor sheet 100 can comprise any number of sensors 101. In the embodiment shown in FIG. 1 the sensor sheet 100 comprises ten sensors 101, denoted S1-S10. One having skill in the art will understand that a flexible sheet having any number of sensors is included in the current disclosure.

The sensor sheet 100 is flexible in all directions. That is, the sensor sheet 100 can be deformed in any X-direction, a Y-direction, and a Z-direction. Since the sensor sheet 100 can bend in all directions, the sensor sheet can conform to the topography of a curved or irregular surface on which the sensor sheet is placed.

Sensors 101 may be any type of a number of different sensor types. Sensors S1-Sn can be thermistors, pressure sensors, or moisture sensors. One having skill in the art will recognize that additional different types of sensors 101 can be used in the flexible sensor sheet 100 while still conforming with the scope of the current disclosure. In one embodiment, the sensor sheet 100 is comprised of sensors S1-Sn where all the sensors S1-Sn are of the same sensor type. For example, all sensors S1-Sn of sensor sheet 100 can be thermistors. In another embodiment, the sensors S1-Sn may be of different sensor types. For example, S1 can be a thermistor, S2 can be a pressure sensor, and S3 can be a moisture sensor.

Flexible sensor sheet 100 is comprised of a continuous flexible material sheet 102. The flexible material sheet 102 can comprise multiple flexible layers 104. The flexible material sheet 102 and flexible layers 104 thereof can be made of a polymer type material. In a preferred embodiment, the flexible layers 104 are made of a polyimide material. In other embodiments, the flexible layers 104 can be made of other epoxy-based negative resists, liquid crystal polymers, polymeric organosilicon compounds, thermoplastics, or other polymer type materials. In an embodiment, the flexible material sheet 102 and the flexible layers 104 thereof can be made of a material with a dielectric constant between 2 and 5 at 1 kHz. In an embodiment, the flexible material sheet 102 and the flexible layers 104 thereof can be made of a material with a glass transition temperature greater than 150 degrees Celsius. In an embodiment, the flexible material sheet 102 and the flexible layers 104 thereof can be made of a material with a Young's modulus of less than 10 GPa.

FIG. 1 illustrates a top view of flexible sensor sheet 100 without the top flexible layer. As will be discussed in greater detail below, each sensor S1-Sn can have one or more conductive pattern layers 106 through which one or more electronic signals are passed. The signal may enter the sensor Sn at an input terminal 108 and exit the sensor Sn at an output terminal 110. The voltage or current of the signal at measured at the input compared to the voltage or current measured at the output can be used to determine certain desired properties. For example, for a thermistor Sn, the voltage or current measured at the input terminal 108 can be compared to the voltage or current measured at the output terminal 110 to determine a temperature measured by the thermistor Sn. One having ordinary skill in the art will understand that sensor Sn can have 3 or 4 terminals to make the sensor Sn a three wire or four wire sensor to improve the accuracy of the sensor Sn.

As will be discussed in greater detail below, each conductive layer of each sensor can be space apart from the other conductive layers of the sensor. The spacing between conductive layers can be in the Z-direction (i.e., between conductive layers on different flexible layers), in the X- or Y-direction (i.e., between conductive layers on the same flexible layer), or a combination of various spacing directions. Adjacent conductive layers of each sensor can be separated by a flexible layer 104 of the flexible material interposed between the adjacent conductive pattern layers 106.

In some embodiments, each flexible layer 104 can be continuous along the entire flexible sensor sheet 100. For example, a first flexible layer 104a, which is a bottom-most flexible layer of flexible sensor sheet 100, can be the bottom most flexible layer for each of the plurality of sensors S-Sn in the Z-direction. For example, a second flexible layer 104b disposed above the first flexible layer 104a in the Z-direction can be continuous throughout the flexible sensor sheet 100 such that the second flexible layer can be a second flexible layer for each of the plurality of sensors S1-Sn. The second flexible layer 104b can be interposed between the first conductive pattern layer 106a and the second conductive pattern 106b of each of the plurality of sensors S1-Sn. Thus, each flexible layer 104 of the flexible sensor sheet 100 can be continuous along the sensor sheet 100 and along each of the plurality of sensors S1-Sn as described herein. In other embodiments, some of the flexible layers 104 and/or the conductive pattern layers 106 can be localized within an X-Y portion of the flexible sensor sheet 100. For example, in some embodiments, different conductive pattern layers 106 and/or different flexible layers 104 can be provided in different X-Y portions of a single flexible sensor sheet 100 to provide for different types of sensors 101.

FIG. 1 illustrates each of the terminals of each sensor S1-Sn have an electric lead 112 with which each of the sensors S1-Sn can be connected to an electrical circuit. The electric leads 112 of each of the sensors 101 can all have an end positioned on a single spot or side of flexible sensor sheet 100. The electric leads 112 of each of the sensors 101 can all have an end positioned within a common connection area or connection block 114 on a single spot or side of flexible sensor sheet 100. Accordingly, a connection point 114 for all of the sensors S1-Sn of sensor sheet 100 can be located at a same side or location of sheet 100.

FIG. 1 illustrates the sensor sheet 100 can comprise nine pressure sensors S1-S9 and one thermistor S10. Although the embodiment of FIG. 1 illustrates nine pressure sensors and one thermistor, one having skill in the art will understand that any number of pressure sensors and thermistors is possible. Sensor sheet 100 can be contoured to a surface to measure pressure differentials across the surface with the pressure sensors S1-S9 and also measure a temperature of the surface with the thermistor S10. As previously mentioned, various combinations of sensors within sensor sheet 100 are possible. There may be a plurality of pressure sensors, a plurality of thermistors, and/or a plurality of humidity sensors in sensor sheet 100 to detect pressure values and/or a pressure gradient, temperature values and/or a temperature gradient, and moisture values and/or a moisture gradient across a surface. The sensors 101 can be disposed on or with the flexible sheet 102 in a pattern known as a sensor array 116. In the illustrated embodiment, the sensors 101 of the sensor array 116 are configured in both X and Y directions, and thus the sensor array is an area array. In other embodiments the sensors 101 of the sensor array 116 can be configured in a single direction (i.e., a single row of sensors), and such sensor array is a linear array.

FIG. 2A illustrates a top view of an example of a humidity sensor 200 that can be used as one, multiple, or all of the sensors 101 in sensor sheet 100 according to an embodiment of this disclosure. FIG. 2B illustrates a cross-sectional view taken along line AA of FIG. 2A. The humidity sensor 200 comprises three separate flexible layers 104 (denoted 104a, 104b and 104c). The humidity sensor 200 further comprises two separate conductive pattern layers 106 (denoted 106a and 106b), wherein each conductive pattern layer can include a respective plate portion 202. The respective plate portions 202 are separated by an intervening portion 204 of the flexible layer 104 to form a capacitor structure 206 between the plate portions as shown in FIG. 2B. In other words, the effective capacitor structure 206 is formed by the pair of spaced-apart electrically conductive plate portions 202 separated by a dielectric comprising the intervening portion 204 of the flexible layer 104b. The humidity sensor 200 can comprise a via 206 connecting the first conductive pattern layer 106a to a terminal at the same level (e.g., the level of third flexible layer 104c) along the third axis as the second conductive pattern layer 106b. The flexible layers 104 can absorb water corresponding to humidity in the atmosphere. The water absorbed by the flexible layers 104 between the respective plate portions 202 changes the dielectric constant between a plate of the first conductive pattern layer 106a and a plate of the second conductive pattern layer 106b. The measured capacitance between first and second conductive pattern layers 106a, 106b can be correlated with humidity to provide a humidity value at each humidity sensor 200. The humidity sensor 200 illustrated in FIGS. 2A and 2B can be termed "vertically integrated."

Figure 3A:
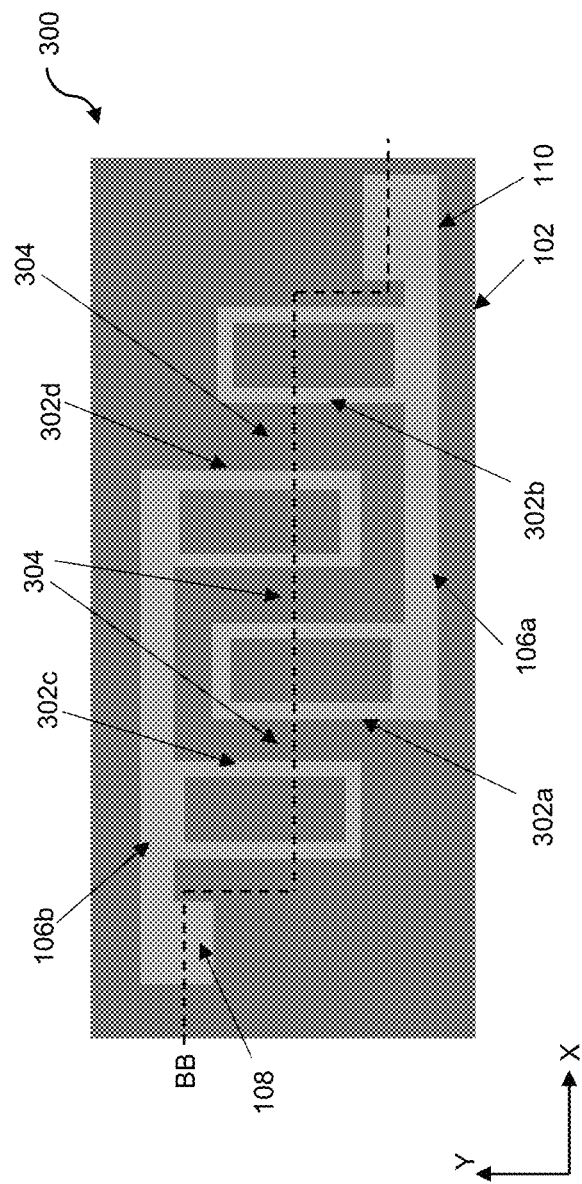
FIG. 3A illustrates a top view of another example of a humidity sensor that can be used as one, multiple, or all of the sensors in a flexible electronic sensor array apparatus according to an embodiment of this disclosure.
Figure 3B:
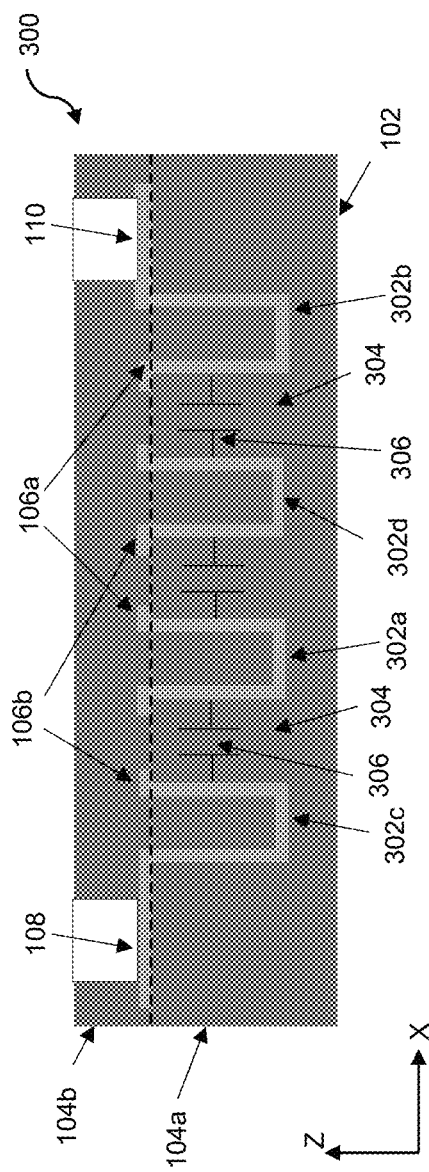
FIG. 3B illustrates a cross-sectional view taken along line BB of FIG. 3A.

FIG. 3A illustrates another example of a humidity sensor 300 that can be used as one, multiple, or all of sensors 101 in sensor sheet 100 according to another embodiment of the disclosure. FIG. 3B illustrates a cross-sectional view taken along line BB of FIG. 3A. The humidity sensor 300 comprises two separate flexible layers 104 (denoted 104a and 104b). The humidity sensor 300 comprises two separate conductive pattern layers 106 (denoted 106a and 106b); however, in this configuration the separate conductive pattern layers can lie at the same level along the third axis and can be formed with a single metal deposition. In the embodiment illustrated in FIGS. 3A and 3B, the humidity sensor 300 comprises four interleaved plates 302 extending along the third axis, with two plates, denoted 302a and 302b, directly electrically connected to the first conductive pattern layer 106a and two other plates, denoted 302c and 302d, directly electrically connected to the second conductive pattern layer 106b. The plates 302 can be formed during metal deposition in a manner similar to that used in formation of vias for direct electrical connections, however, each plate is directly electrically connected to only one pattern layer 106a or 106b. The intervening portions 304 of the flexible layer 104a between the respective plates 302a, 302b of the first conductive pattern layer 106a and the respective plates 302c, 302d of the second conductive pattern layers 106b form respective capacitor structures 306 as shown in FIG. 3B. Similar to those previously described, each effective capacitor structure 306 is formed by the pairs of spaced-apart electrically conductive plate portions 302 separated by a dielectric comprising the intervening portions 304 of the flexible layer 104a. The flexible layers 104 can absorb water corresponding to humidity in the atmosphere. The water absorbed by the flexible layers 104 changes the dielectric constant of the intervening portions 304 between the plates 302. The measured capacitance between the plates 302 on each conductive pattern layer 106 can be correlated with humidity to provide a humidity value at each humidity sensor. The humidity sensor 300 illustrated in FIGS. 3A and 3B can be termed "horizontally integrated."

FIGS. 4A and 4B illustrate an example of a thermistor type temperature sensor 400 that can be used as one, multiple, or all of the sensors 101 in sensor sheet 100 according to another embodiment of this disclosure. FIG. 4A illustrates a top view of the temperature sensor 400 with the topmost flexible layer removed for purposes of illustration. FIG. 4B illustrates a cross-sectional view taken along line CC of FIG. 4A. In the embodiment illustrated in FIGS. 4A and 4B, the temperature sensor 400 is comprised of four separate flexible layers 104 (denoted 104a, 104b, 104c and 104d respectively). The illustrated temperature sensor 400 comprises four separate flexible layers 104. The illustrated temperature sensor 400 comprises three separate conductive pattern layers 106 (denoted 106a, 106b and 106c). The illustrated temperature sensor 400 comprises two vias, denoted 408a and 408b, connecting the first conductive pattern layer 106a and the second conductive pattern layer 106b. The illustrated temperature sensor further comprises two other vias, denoted 408c and 408d, connecting the second conductive pattern 106b and the third conductive pattern 106c. The measured electrical resistance between an input terminal 108 and output terminal 110 of the thermistor temperature sensor 400 can be correlated with a temperature value at the temperature sensor. Other types of temperature sensors can be used in other embodiments for some or all of the electronic sensors.

Figure 5C:
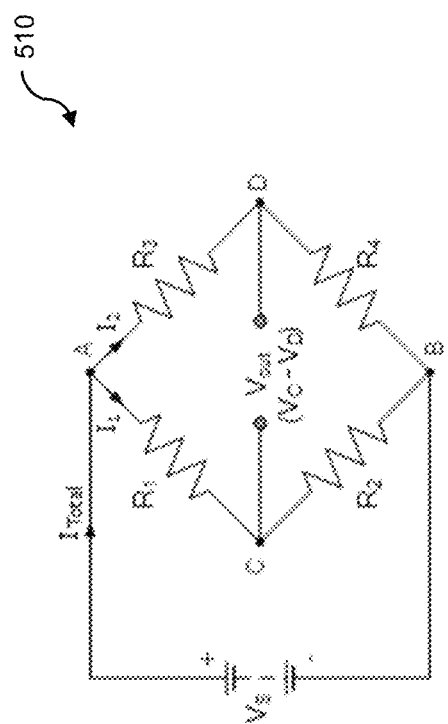
FIG. 5C illustrates an electrical schematic of the pressure sensor illustrated in FIG. 5A.

FIG. 5A illustrates an example of a pressure sensor 500 that can be used as one, multiple, or all of the sensors 101 in sensor sheet 100 according to another embodiment of this disclosure. One skilled in the art will understand that the pressure sensor 500 can also be used as a strain gauge or a force sensor. FIG. 5B illustrates a cross-sectional view taken along line DD of FIG. 5A. FIG. 5C illustrates an electrical schematic of the pressure sensor illustrated in FIG. 5A. For illustration purposes, the flexible material layer 102 comprising flexible layers 104 of the pressure sensor 500 are not illustrated in FIG. 5A. However, the flexible material layer 102 and flexible layers 104 are illustrated in the cross-sectional view of FIG. 5B.

The flexible layers 104 of the pressure sensor 500 can be configured into a relatively more flexible membrane portion 512 and a relatively less flexible body portion 514. In the embodiment illustrated in FIG. 5B, the membrane portion 512 is configured to be thinner (i.e., in the Z-direction) than the body portion 514. In other embodiments, the lower flexible layer(s) (e.g., 104a and 104b of FIG. 5B) comprising both the membrane portion 512 and the lower layer(s) of body portion 514 can be formed of a first material and the upper flexible layer(s) (e.g., 104c of FIG. 5B) comprising the upper layer(s) of the body portion can be formed of a second material with less flexibility, thereby resulting in the membrane portion being relatively more flexible than the body portion. In the illustrated embodiment, the membrane portion 512 is configured in a circular shape, viewed from above; however, in other embodiments the membrane portion may be configured in other shapes.

The pressure sensor 500 of FIGS. 5A-5C can include four piezoresistors 502, denoted R1, R2, R3, and R4. In the illustrated embodiment, the piezoresistors R1, R2, R3, and R4 are all designed to have the same resistance. The piezoresistors 502 are disposed on the membrane portion 512 of the pressure sensor 500 with a first pair the piezoresistors (e.g., R1 and R4) positioned on the membrane portion relatively closer to the body portion 514 and a second pair of the piezoresistors (e.g., R2 and R3) positioned on the membrane portion relatively farther from the body portion. The piezoresistors 502 can be electrically connected to form a voltage divider circuit 510 wherein a first piezoresistor of the first pair (e.g., R1) and a first piezoresistor of the second pair (e.g., R2) are connected to form a first leg of the voltage divider circuit, and a second piezoresistor of the first pair (e.g., R4) and a second piezoresistor of the second pair (e.g., R3) are connected to form a second leg of the voltage divider circuit. The piezoresistors 502 can further be connected in the voltage divider circuit 510 such that one piezoresistor of the first pair (e.g., R1) is connected on one leg between the source $V_S$ and the output $V_{out}$ and one piezoresistor of the second pair (e.g., R3) is connected on the other leg between the $V_S$ and the $V_{out}$.

As illustrated in FIG. 5C, the pressure sensor 500 works as a current divider 510 having a source voltage ($V_S$) and total current ($I_{Total}$), wherein a first half of the current ($I_2$) flows through piezoresistors R3 and R4 and a second half of the current ($I_1$) flows through piezoresistors R1 and R2. Since the flexible membrane portion 512 of the pressure sensor 500 is relatively more flexible than the body portion 514, any pressure (P) or force (F) (denoted by arrow in FIG. 5B) applied to the membrane portion will cause the central portion of the membrane portion (where the first pair of piezoresistors are mounted) to deflect or strain more that the outer portions of the membrane (where the second pair of piezoresistors are mounted). If there is no pressure or force applied and all piezoresistors R1, R2, R3, and R4 have the same resistance, the voltage between points C and D will be zero as the voltage will be equally divided between points AD and points AC (i.e., since the same current will flow through segments A-D and A-C). However, since resistors R1, R2, R3, and R4 are piezoresistors, the resistance of these resistors changes when they are strained, e.g., by the deflection of the applied force F or pressure P. Piezoresistors R3 and R2 are closer to the center of the membrane than piezoresistors R1 and R4, so piezoresistors R2 and R3 will change resistance more than piezoresistors R1 and R4 when pressure is applied. When pressure is applied, the piezoresistors R1, R2, R3, and R4 are no longer equal so the voltage will not be divided evenly as in the static case. Since piezoresistor R3 changes more than piezoresistor R1 since it is closer to the center of the membrane, there will now be a voltage difference between points C and D ($V_{out}$) that is proportional to the force applied. By measuring the voltage differential between points C and D ($V_{out}$), the pressure or force being applied to the membrane can be determined.

Although the pressure sensor 500 described in the previous embodiment uses piezoresistors 502 all having the same resistance value, other embodiments can use piezoresistors 502 having different resistance values by compensating for the difference in output $V_{out}$ using the well-understood properties of the voltage divider circuit 510.

The pressure sensor 500 can comprise three separate flexible layers 104 (denoted 104a, 104b and 104c). The pressure sensor 500 comprises a first conductive pattern layer 106a comprising the piezoresistors 502, i.e., R1, R2, R3, and R4. In one embodiment, the piezoresistors 502 can be made of Nichrome. In some embodiments, the first conductive pattern layer 106a can further comprise tabs 504 configured to electrically connect the piezoresistors 502 to one another and/or to other portions of the sensor circuit. In some embodiments, the tabs 504 of the first conductive layer 106a can be made of Nichrome with the same metal deposit as the piezoresistors 502. The pressure sensor 500 further comprises a second conductive pattern layer 106b that can comprise leads 506 configured to electrically connect the piezoresistors 502 to other portions of the circuit. The pressure sensor 500 can further comprise vias 508 electrically connecting the first conductive layer 106a and the second conductive layer 106b. In some embodiments, the second conductive layer 106b can be made of a metal. In some embodiments, the second conductive layer 106b can be made of platinum, gold, or a combination of platinum and gold.

As best seen in FIG. 5A, in one embodiment of the pressure sensor 500, the flexible membrane portion 512 can be configured in a circular shape, with the outer pair of piezoresistors 502 (e.g., R1 and R4) positioned on opposite edges of the circular membrane portion adjacent the body portion 514 and with the central pair of piezoresistors (e.g., R2 and R3) positioned near the center of the circular membrane between the outer pair. Four electrically conductive tabs 504 are provided to electrically connect the piezoresistors with one another as part of the voltage divider circuit. In some embodiments, each tab 504 includes an arcuate portion 516 disposed along the periphery of the flexible membrane portion 512. In some embodiments, the arcuate portions 516 of the tabs 504 can be disposed on the flexible membrane portion 512, and in other embodiments, the arcuate portions of the tab can be disposed within the body portion 514. In some embodiments, each tab 504 includes a radial portion 518 disposed across the flexible membrane from the center piezoresistors. In some embodiments, each radial portion 518 of the tabs 504 is disposed midway between the outer pair of piezoresistors (e.g., R1 and R4) and perpendicular to an imaginary line connecting the outer pair.

Although the present disclosure has been described with various embodiments, various changes and modifications may be suggested to one skilled in the art. It is intended that the present disclosure encompass such changes and modifications as falling within the scope of the appended claims.

What is claimed is:

1. A flexible electronic force sensor device comprising:
a first flexible layer formed of a first flexible material and defining a membrane portion surrounded by a body portion;
wherein the body portion is less flexible than the membrane portion;
wherein the membrane portion is configured in a circular shape, viewed in the Z-direction;
a first conductive layer formed on the first flexible layer, the first conductive layer including a first pair of piezoresistors and a second pair of piezoresistors formed on respective regions of the membrane portion;
wherein the first pair of piezoresistors are disposed on first regions of the membrane portion that are relatively less strained by an external force applied to the membrane portion and the second pair of piezoresistors are disposed on second regions of the membrane portion that are relatively more strained by the external force applied to the membrane portion such that when the external force is applied to the membrane portion the piezoresistors of the second pair are strained more that the piezoresistors of the first pair and a resistance value of the piezoresistors of the second pair changes more that the resistance value of the piezoresistors of the first pair, wherein the first regions for the first pair of piezoresistors are positioned relatively closer to the body portion than the second regions for the second pair of piezoresistors;
a second flexible layer formed of a second flexible material over at least some of the first conductive layer;
a second conductive layer formed on the second flexible layer and disposed at least partially over the body portion;
wherein the first and second flexible layers comprise at least one of polyimides, epoxy-based resists, liquid crystal polymers, polymeric organosilicon compounds, thermoplastics, or other polymer type materials;
wherein the first and second conductive layers include electrical tabs that interconnect the piezoresistors into an electrical circuit arrangement extending from the membrane portion to terminals disposed in the body portion;
wherein the electrical tabs that interconnect the piezoresistors into an electrical circuit arrangement comprise:
arcuate portions disposed along a periphery of the flexible membrane portion; and
radial portions disposed across the flexible membrane portion, the radial portions electrically connecting the arcuate portions to a piezoresistor of the second pair of piezoresistors;
wherein the first and second conductive layers are interconnected through conductive vias formed through the second flexible layer;
wherein the first and second flexible layers and first and second conductive layers collectively form a device configured as a flexible sheet; and
wherein applying an input voltage to the electrical circuit arrangement results in a variable output voltage at the terminals that corresponds to the difference in change of the resistance values between the first and second pair of piezoresistors that can be correlated to the external force applied to the membrane portion.

2. The electronic force sensor device of claim 1, wherein the membrane portion of the flexible sheet is more flexible than the body portion.

3. The electronic force sensor device of claim 2, wherein the body portion of the flexible sheet includes a third flexible layer making the first flexible layer and the second flexible layer of the body portion thicker, measured in the Z-direction, than the first flexible layer and the second flexible layer of the membrane portion.

4. The electronic force sensor device of claim 3, wherein the third flexible layer is formed of a third flexible material that is less flexible than the first flexible material.

5. The electronic force sensor device of claim 1, wherein the electrical circuit arrangement is configured as a voltage divider having a first leg including a first piezoresistor from the first pair and a first piezoresistor from the second pair and a second leg including a second piezoresistor from the first pair and a second piezoresistor from the second pair.

6. The electronic force sensor device of claim 5, wherein the output of the electrical circuit arrangement is a voltage measured between:
a first electrical junction on the first leg between the first piezoresistor from the first pair and the first piezoresistor from the second pair; and
a second electrical junction on the second leg between the second piezoresistor from the first pair and a second piezoresistor from the second pair.

7. The electronic force sensor device of claim 6, wherein one of the first pair of piezoresistors is connected between a voltage source and the first electrical junction of the first leg and one of the second pair of piezoresistors is connected between the voltage source and the second electrical junction of the second leg.

8. The electronic force sensor device of claim 1, further comprising electrical vias extending in the Z-direction from the tabs on the first conductive layer to leads formed in the second conductive layer.

9. A flexible electronic pressure sensor device comprising:
a first flexible layer formed of a first flexible material and defining a membrane portion surrounded by a body portion;
wherein the body portion is less flexible than the membrane portion;

wherein the membrane portion is configured in a circular shape, viewed in the Z-direction;

a first pair of piezoresistors formed on first regions of the membrane portion that are adjacent to a periphery of the membrane portion;

a second pair of piezoresistors formed on second regions of the membrane portion that are in the center of the membrane portion such that the first regions for the first pair of piezoresistors are positioned relatively closer to the body portion than the second regions for the second pair of piezoresistors;

a first conductive layer formed on the membrane portion and connecting the piezoresistors into an electrical circuit configured as a voltage divider; a second flexible layer formed of a second flexible material over at least some of the first conductive layer;

a second conductive layer formed over at least some of the second flexible layer;

wherein the first and second flexible layers comprise at least one of polyimides, epoxy-based resists, liquid crystal polymers, polymeric organosilicon compounds, thermoplastics, or other polymer type materials;

wherein the voltage divider has a first leg including a first piezoresistor from the first pair and a first piezoresistor from the second pair and a second leg including a second piezoresistor from the first pair and a second piezoresistor from the second pair;

wherein the output of the voltage divider is a voltage measured between a first electrical junction on the first leg between the first piezoresistor from the first pair and the first piezoresistor from the second pair and a second electrical junction on the second leg between the second piezoresistor from the first pair and a second piezoresistor from the second pair;

wherein one of the first pair of piezoresistors is connected between a voltage source and the first electrical junction of the first leg and one of the second pair of piezoresistors is connected between the voltage source and the second electrical junction of the second leg;

wherein the first flexible layer, piezoresistors and first conductive layer collectively form a device configured as a flexible sheet;

wherein the first regions of the membrane portion are relatively less deflected by an external pressure applied to the membrane portion than the second regions of the membrane portion such that when the external pressure is applied to the membrane portion the piezoresistors of the second pair are strained more that the piezoresistors of the first pair and a resistance value of the piezoresistors of the second pair changes more that the resistance value of the piezoresistors of the first pair;

wherein applying an input voltage to the electrical circuit results in a variable output voltage at the terminals that corresponds to the difference in change of the resistance values between the first and second pair of piezoresistors that can be correlated to the external pressure applied to the membrane portion;

wherein the first conductive layer comprises:

arcuate portions disposed along the periphery of the flexible membrane portion; and radial portions disposed across the flexible membrane portion, the radial portions electrically connecting the arcuate portions to a piezoresistor of the second pair of piezoresistors;

wherein the second conductive layer is electrically connected to the voltage divider circuit of the first conductive layer and includes electrical leads for moving the output voltage through the body portions of the flexible sheet; and wherein the first and second conductive layers are interconnected through conductive vias formed through the second flexible layer.

10. The flexible electronic pressure sensor device of claim 9, wherein the first and second pairs of piezoresistors are formed of Nichrome.

11. The flexible electronic pressure sensor device of claim 9, wherein the first and second pairs of piezoresistors are formed from the first conductive layer.

12. The flexible electronic pressure sensor device of claim 11, wherein the first and second pairs of piezoresistors and the first conductive layer are formed of Nichrome.

13. The flexible electronic pressure sensor device of claim 9, further comprising a plurality of electrical vias extending in the Z-direction from the first conductive layer through the second flexible layer to the second conductive layer.

* * * * *